(12) United States Patent
Tseng (10) Patent No.: US 6,348,383 B1
(45) Date of Patent: Feb. 19, 2002

(54) METHOD OF FORMING POLY GATE AND POLYCIDE GATE WITH EQUAL HEIGHT

(75) Inventor: Horng-Huei Tseng, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 09/686,940

(22) Filed: Oct. 12, 2000

Related U.S. Application Data (63) Continuation-in-part of application No. 09/298,964, filed on Apr. 26, 1999, now Pat. No. 6,168,997.

(51) Int. Cl.$^7$ .......................................... H01L 21/8234
(52) U.S. Cl. ....................... 438/275; 438/592; 438/595
(58) Field of Search .................................. 438/241, 258, 438/275, 592, 595, 655, 657

(56) References Cited

U.S. PATENT DOCUMENTS 5,604,157 A * 2/1997 Dai et al. .................... 438/592
6,103,610 A * 8/2000 Blair ........................... 438/592
6,168,997 B1 * 1/2001 Tseng .......................... 438/275

FOREIGN PATENT DOCUMENTS

JP          4-303944          * 10/1992

* cited by examiner

Primary Examiner—Chandra Chaudhari
(74) Attorney, Agent, or Firm—Bacon & Thomas (57) ABSTRACT

The present invention discloses a method of forming a poly gate and a polycide gate with an equal height in a semiconductor device fabricated on a substrate, comprising the steps of forming the steps of forming a gate oxide layer on a substrate; sequentially depositing a poly-silicon layer and a capped dielectric layer; patterning a polycide gate by using a first photo-resist layer, and then etching the capped dielectric layer and a portion of the poly-silicon layer having a certain thickness; removing the first photo-resist layer; performing thermal oxidation on the poly-silicon layer so as to form a silicon oxide layer on the poly-silicon layer; forming spacers on the sidewall of the poly-silicon layer; depositing a silicide layer; patterning a poly gate by using a second photo-resist layer, and etching the silicide layer; anisotropically etching the poly-silicon layer; and finally removing the second photo-resist layer.

16 Claims, 7 Drawing Sheets

METHOD OF FORMING POLY GATE AND POLYCIDE GATE WITH EQUAL HEIGHT

This application is a Continuation-in-part of nonprovisional application No. 09/298,964 now U.S. Pat. No. 6,168,997, filed Apr. 26, 1999.

BACKGROUND OF THE INVENTION

1. Field of the Invention

The present invention is a continuation-in-part (CIP) of U.S. patent application Ser. No. 09/298,964. It generally relates to a method of forming MOSFETs in an integrated circuit (IC), and more particularly, to a method of forming a poly gate and a polycide gate with an equal height on one chip.

2. Description of the Prior Art

The present invention is a continuation-in-part (CIP) of U.S. Pat. application Ser. No. 09/298,964. Integrating the periphery circuits on a chip is a stream of electronic products in the technology development of the electronic industry. Recently, the improvement of semiconductor processing has made the integration of memory cells and periphery circuits on one chip possible.

Taking an image device as an example, in order to improve the performance and resolution of images, each image has to be divided into millions of pixels. Then each pixel is stored in a memory cell in the form of digital data. One aspect to show the characteristics of an image device is the accuracy of electronic signals stored in memory cells for each pixel array. If the problem of current leakage occurs in the memory cells, the electronic signals of pixels cannot be recorded exactly which will produce many dots on the image. Another aspect to show the characteristics of an image device is the accessing speed of the periphery circuits integrated on the chip. The accessing speed has to be fast enough for dealing with a great amount of data. Therefore, for an image device a chip should correspond to two demands concurrently. One of the demands is that current leaking is rigidly limited, but the accessing speed is not important. Another demand is that a high accessing speed is necessary, but the current leaking is not the key consideration.

In a semiconductor device, a metal-oxide-semiconductor field-effect transistor (MOSFET) is one of the most important elements for the VLSI integrated circuits. A MOSFET includes a gate structure, a source and a drain, wherein the source and drain are located at the sides of the gate structure. The gate structure includes a metal layer at the top referred to as gate electrode, an oxide layer under the metal layer referred to as gate oxide, and a semiconductor layer at the bottom.

Typically, the metal layer at the top of the gate structure is formed of poly-silicon, thereby the gate structure is referred to as poly gate. Because poly-silicon does not have a lowest resistance, sometimes a layer of suicide is deposited overlying the poly-silicon layer to form a polycide gate for lowering the resistance.

Because poly gate does not have a lowest resistance, its accessing speed is not the fastest. But the problem of current leaking in poly gate is not serious, which makes poly gate be a good element for the pixel array area in an image device. On the other hand, the problem of current leaking in polycide gate is worse than that in poly gate, but polycide gate has a lower resistance, which can decrease the TC time delay and increase the device switching speed. Therefore, the polycide gate is better than poly gate to be the element for the periphery circuit area in an image device for providing a high speed to deal with a great amount of pixel data in the periphery circuit area.

Figure 1:
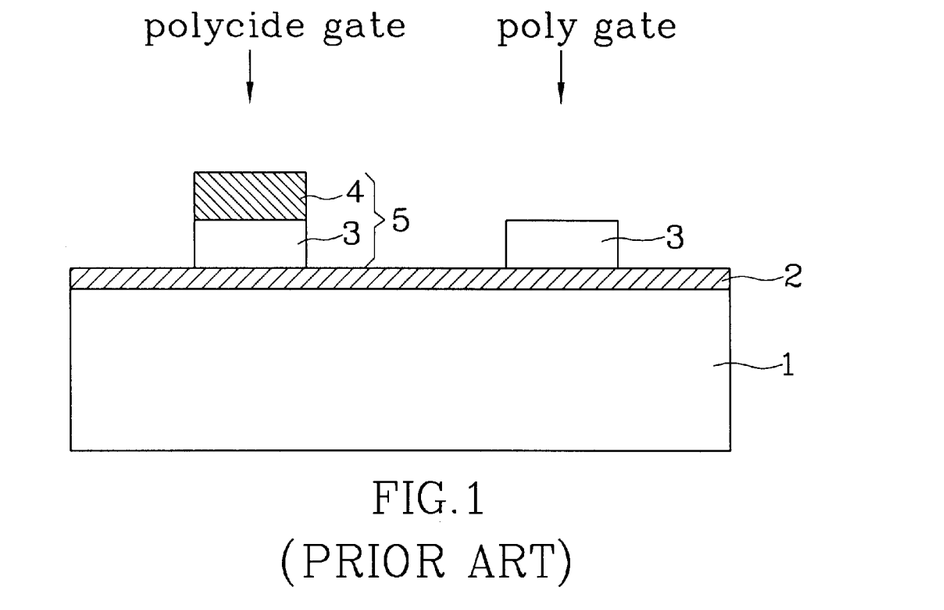
FIG. 1 is a cross-sectional view showing a poly gate and a polycide gate formed on a substrate in the prior art.

In order to form poly gate and polysice gate on one silicon substrate concurrently, several issues about the process and products are derived. Referring now to FIG. 1, a cross-sectional view of the poly gate and polycide gate formed on a substrate according to a prior art of the present invention, a gate oxide layer 2 is formed on a semiconductor substrate 1. Then, a poly gate including a poly-silicon layer 3 is formed at the poly gate area by the methods of deposition, photolithography and etching. Next, a polycide gate is formed at the polycide gate area, wherein the polycide gate has a poly-silicon layer 3 and a silicide layer 4.

Because poly-silicon has a higher resistance than polycide, and the height of poly gate is lower than the height of polycide gate, as shown in FIG. 1, the conventional structure in FIG. 1 makes the poly gate have a much higher sheet resistance than the polycide gate. Therefore, the accessing speed of the products produced by the conventional technology is not good enough. For the image device described above, the obvious difference of accessing speed between the cell area and the periphery area cannot make the device achieve a best operating state. Therefore, the present invention seeks to provide a method for solving this problem.

SUMMARY OF THE INVENTION

It is an object of the present invention to provide a method of forming a poly gate and a polycide gate with an equal height in a semiconductor device fabricated on a substrate to reduce the sheet resistance of the poly gate electrode.

In order to achieve the foregoing object, the present invention provides a method of forming a poly gate and a polycide gate with an equal height in a semiconductor device fabricated on a substrate, comprising the steps of forming a gate oxide layer on a substrate; sequentially depositing a first poly-silicon layer, a silicide layer, and a capped dielectric layer; patterning a polycide gate by using a first photo-resist layer, and then etching the capped dielectric layer and the silcide layer; removing the first photo-resist layer; forming spacers on the sidewall of the silicide layer; depositing a second poly-silicon layer; patterning a poly gate by using a second photo-resist layer, and etching the first poly-silicon layer and the second poly-silicon layer; and finally removing the second photo-resist layer.

Alternatively, the present invention provides another method of forming a poly gate and a polycide gate with an equal height in a semiconductor device fabricated on a substrate, comprising the steps of forming a gate oxide layer on a substrate; sequentially depositing a poly-silicon layer and a capped dielectric layer; patterning a polycide gate by using a first photo-resist layer, and then etching the capped dielectric layer and a portion of the poly-silicon layer having a certain thickness; removing the first photo-resist layer; performing thermal oxidation on the poly-silicon layer so as to form a silicon oxide layer on the poly-silicon layer, forming spacers on the sidewall of the poly-silicon layer; depositing a silicide layer; patterning a poly gate by using a second photo-resist layer, and etching the silicide layer; anisotropically etching the poly-silicon layer; and finally removing the second photo-resist layer.

BRIEF DESCRIPTION OF THE DRAWINGS

Embodiments of the invention will now be described by way of example, with reference to the accompanying drawings, in which.

DETAILED DESCRIPTION OF THE PREFERRED EMBODIMENT

Figure 2:
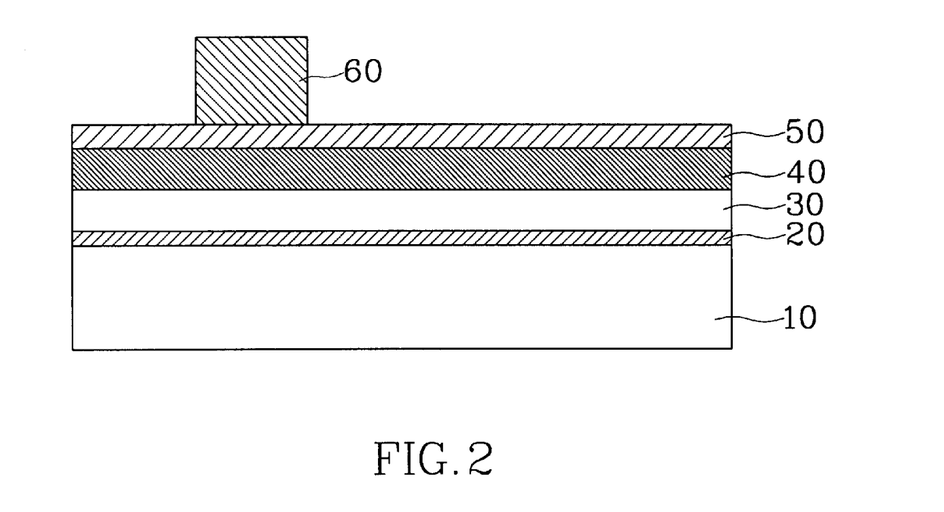
FIG. 2 is a cross-sectional view showing a semiconductor substrate on which are formed a gate oxide layer, a first poly-silicon layer, a silicide layer, a capped dielectric layer, and a first photo-resist layer according to a first embodiment of the present invention.

In a method of forming poly gate and polycide gate in a semiconductor device fabricated on a substrate according to a first embodiment of the present invention, a substrate of semiconductor silicon wafer 10 for an integrated circuit is provided, as shown in FIG. 2. The substrate wafer is provided with a gate oxide layer 20 having a thickness between 50~300 Å overlying an active area.

Subsequently, a first poly-silicon layer 30 having a thickness between 500~3000 Å is deposited. The first poly-silicon layer 30, which is in-situ doped CVD poly-silicon, is used to be a portion of a poly gate and the poly-silicon layer of a polycide gate. Thereafter, a silicide layer 40 having a thickness between 300~3000 Å is deposited for the polycide gate. Silicide, which has a lower sheet resistance than poly-silicon and forms the ohmic contact between poly-silicon and metal, can reduce the RC time delay and increase the device operation speed. The metal element in the silicide is selected from the group of refractory metals, such as Ti, Mo, Ta, Pt, and W. Tungsten silicide ($WSi_x$) is usually provided for semi-conductor processing because its thermal extension coefficient closes to the thermal extension coefficient of silicon, which makes a low stress between suicide and poly-silicon.

Next, a capped dielectric layer 50 having a thickness between 500~3500 Å is deposited by chemical vapor deposition (CVD). The capped dielectric layer 50 is CVD silicon oxide or CVD silicon nitride The capped dielectric layer 50 is used to be a mask for protecting the silicide layer from etching in the following poly-silicon etching step. Then, a photo-resist layer 140 is formed in the polycide gate region with a mask for patterning a polycide gate and serving as a mask for etching process, as shown in FIG. 2.

Figure 3:
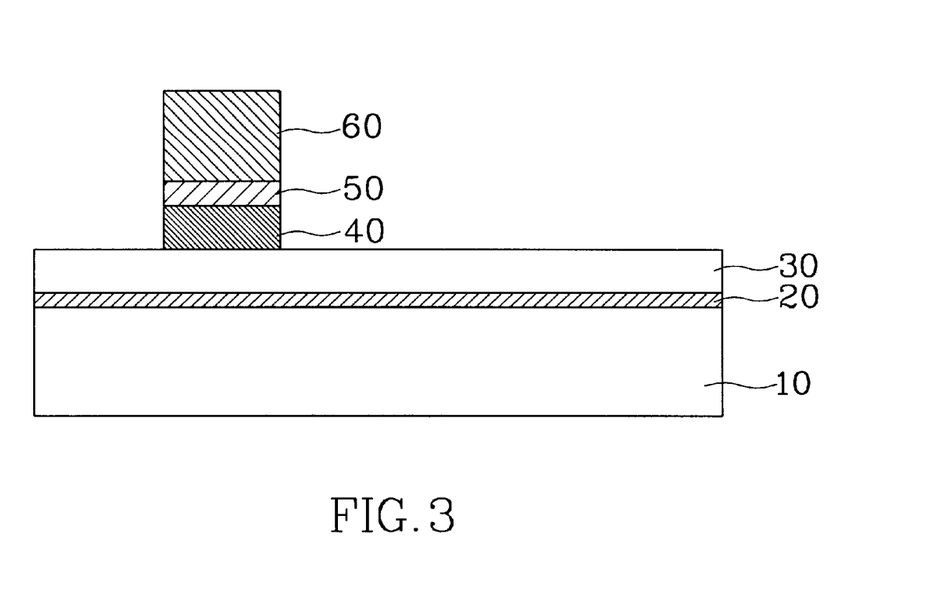
FIG. 3 is a cross-sectional view showing the etching of the capped dielectric layer and the silicide layer according to a first embodiment of the present invention.
Figure 4:
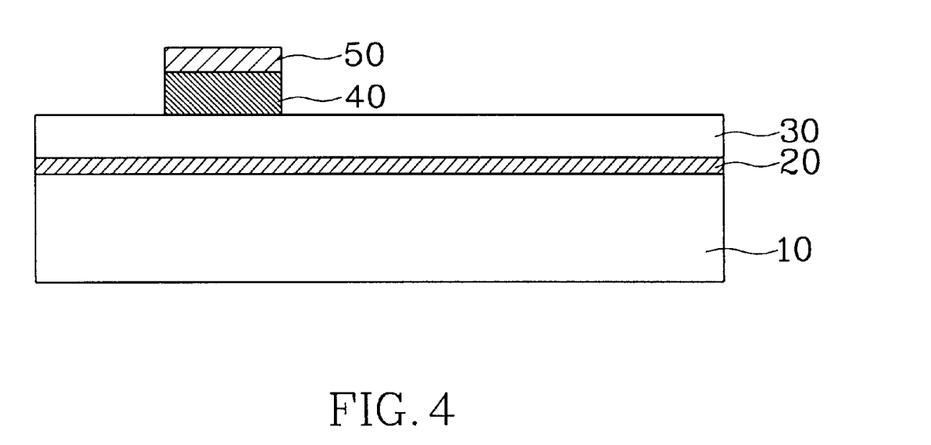
FIG. 4 is a cross-sectional view showing the removal the first photo-resist layer according to a first embodiment of the present invention.

Referring now to FIG. 3, the capped dielectric layer 50 and silicide layer 40 are etched sequentially. This etching step is stopped at the first poly-silicon layer 30 by the end-point mode. Then, the photo-resist layer 60 is removed, as shown in FIG. 4.

Figure 5:
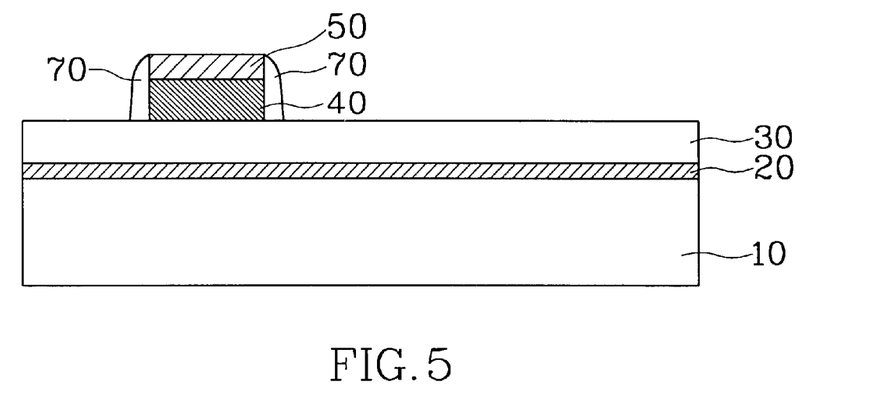
FIG. 5 is a cross-sectional view showing tile formation of spacers on the sidewall of the silicide layer according to a first embodiment of the present invention.

Next, spacers 70 are formed on the sidewall of the silicide layer, as shown in FIG. 5. The silicide sidewall spacers 70 are formed by depositing a layer of capped dielectric material and then etching the capped dielectric material layer anisotropically, wherein the capped dielectric material can be CVD silicon oxide or CVD silicon nitride.

Figure 6:
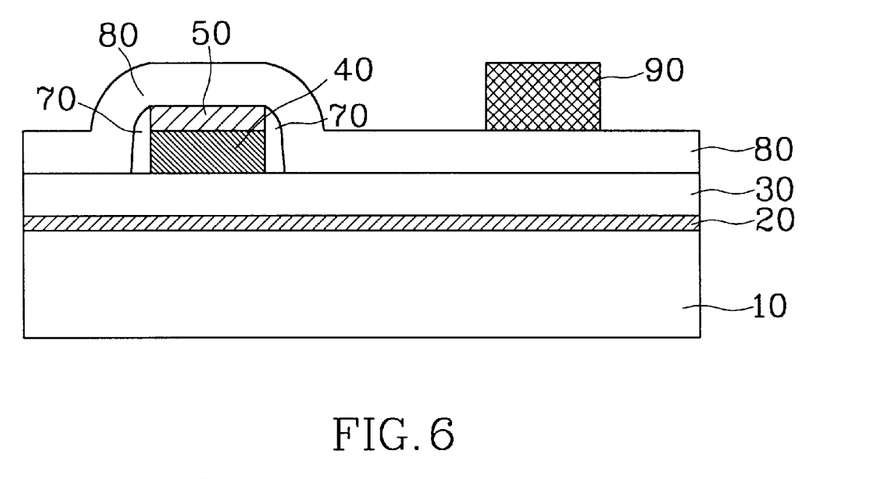
FIG. 6 is a cross-sectional view showing the deposition of a second poly-silicon layer and the formation of a second photo-resist layer according to a first embodiment of the present invention.

Referring now to FIG. 6, a second poly-silicon layer 80 is deposited with a thickness between 300~3000 Å, wherein the thickness is almost equal to the thickness of the silicide layer 40. The second poly-silicon layer 80, which is in-situ doped CVD poly-silicon, is used to be a portion of the poly gate. Then, a second photo-resist layer 90 is formed with a poly gate pattern as a mask for defining a poly gate.

Figure 7:
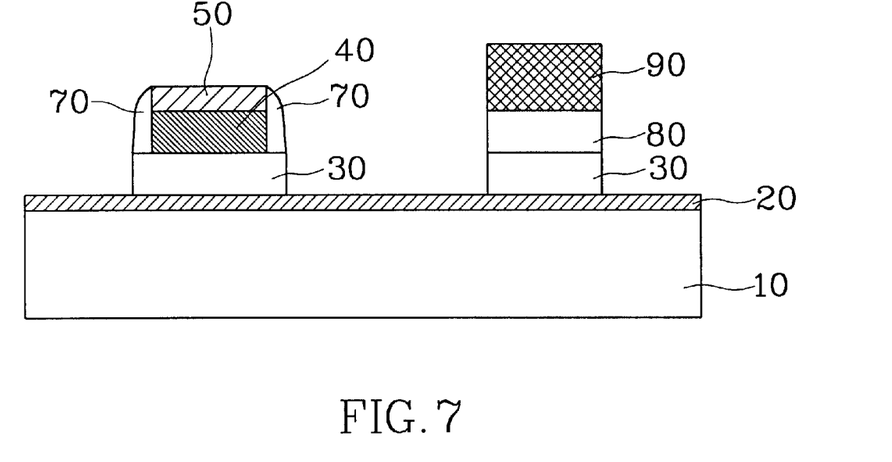
FIG. 7 is a cross-sectional view showing the etching of the first poly-silicon layer and the second poly-silicon layer according to a first embodiment of the present invention.
Figure 8:
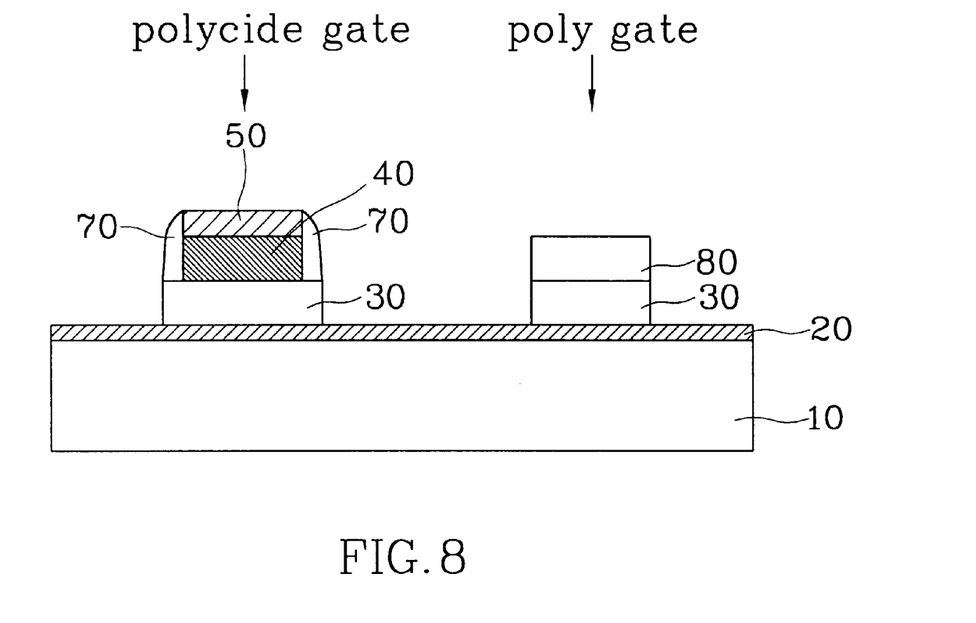
FIG. 8 is a cross-sectional view showing the removal of the second photo-resist layer according to a first embodiment of the present invention.

Subsequently, the second poly-silicon layer 80 and the first poly-silicon layer 30 are etched sequentially, as shown in FIG. 7. During this etching step, the poly gate is protected by photo-resist layer 90, and the polycide gate is protected by the capped dielectric layer 50 and spacers 70. Finally, the second photo-resist layer 90 is removed to finish the fabrication of poly gate and polycide gate with an almost equal height, as shown in FIG. 8

In a method of forming poly gate and polycide gate in a semiconductor device fabricated on a substrate according to a second embodiment of the present invention a substrate of semiconductor silicon wafer 10 for an integrated circuit is provided, as shown in FIG. 2. The substrate wafer is provided with an gate oxide layer 20 having a thickness between 50~300 Å overlying an active area.

Subsequently a first poly-silicon, layer 30 having a thickness between 500~3000 Å is deposited. The first poly-silicon layer 30, which is in-situ doped CVD poly-silicon, is used to be a portion of a poly gate and the poly-silicon layer of a polycide gate. Thereafter, a silicide layer 40 having a thickness between 300~3000 Å is deposited for the polycide gate. The metal element in silicide is selected from the group of refractory metals, such as Ti, Mo, Ta, Pt, and W. Tungsten silicide (WSi$_x$) is usually provided for semi-conductor processing.

Next, a capped dielectric layer 50 having a thickness between 500~3500 Å is deposited by chemical vapor deposition (CVD). The capped dielectric layer 50 is CVD silicon oxide or CVD silicon nitride. The chapped dielectric layer 50 is used to be a mask for protecting the silicide layer from etching in the following poly-silicon etching step. Then, a first photo-resist layer 60 is formed with a polycide gate pattern as a mask for defining a polycide gate, as shown in FIG. 2.

Referring now to FIG. 3, the capped dielectric layer 50 and suicide layer 40 are etched sequentially. This etching step is stopped at the first poly-silicon layer 30 by the end-point mode. Then, the photo-resist layer 60 is removed, as shown in FIG. 4, Next, a second poly-silicon layer 80 is deposited with a thickness between 300~3000 Å, wherein the thickness is almost equal to the thickness of the silicide layer 40, as shown in FIG. 6 without the spacers 70 The second poly-silicon layer 80, which is in-situ doped CVD poly-silicon, is used to be a portion of the poly gate. Then, a second photo-resist layer 90 is formed with a poly gate pattern as a mask for defining a poly gate.

Figure 9:
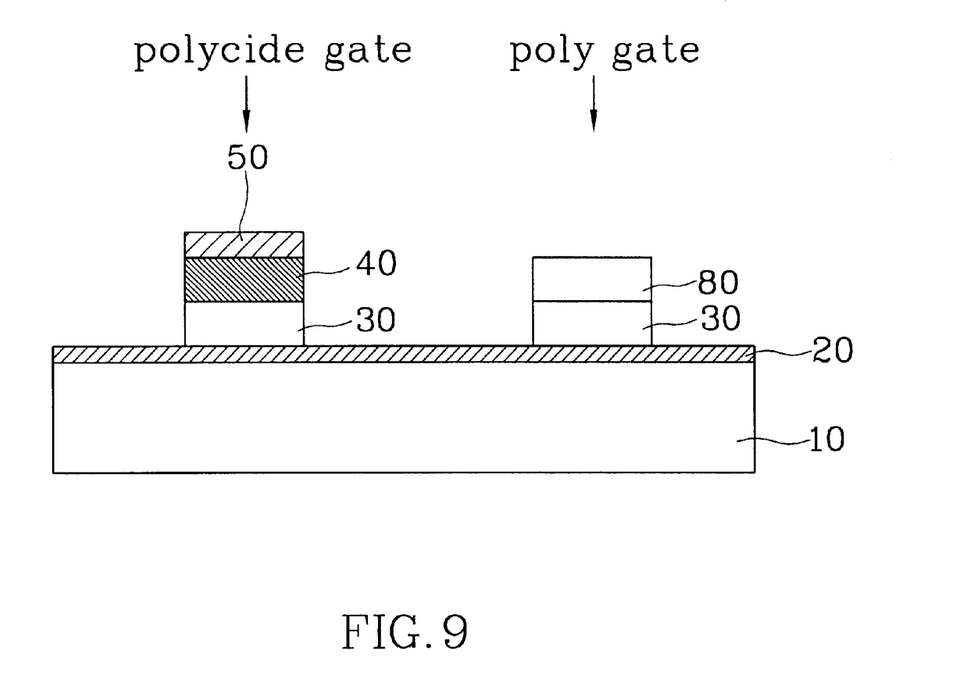
FIG. 9 is a cross-sectional view showing a poly gate and a polycide gate with an equal height formed on a substrate according to a second embodiment of the present invention.

Subsequently, the second poly-silicon layer 80 and the first poly-silicon layer 30 are etched sequentially, as shown in FIG. 7 without the spacers 70 During this etching step, the poly gate is protected by photo-resist layer 90, and the polycide gate is protected by the capped dielectric layer 50. Finally, referring now to FIG. 9, the second photoresist layer 90 is removed to finish the fabrication of poly gate and polycide gate with an almost equal height.

Figure 10:
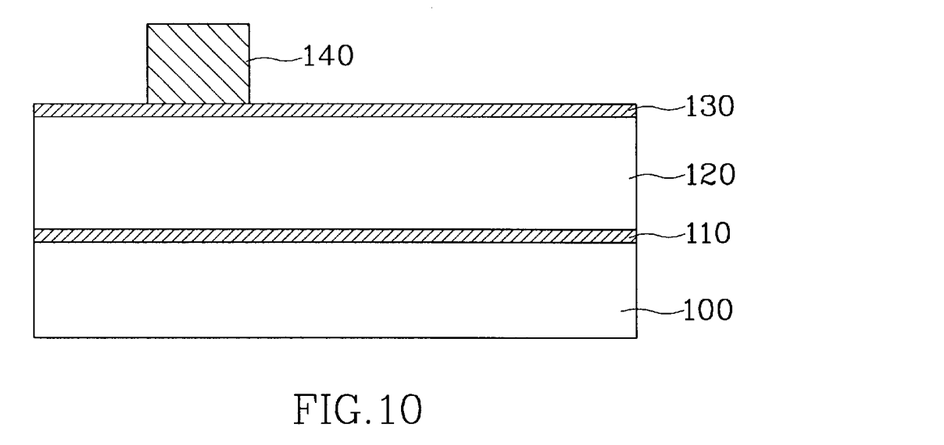
FIG. 10 is a cross-sectional view showing a semiconductor substrate on which are formed a gate oxide layer, a poly-silicon layer, a capped dielectric layer, and a first photo-resist layer according to a third embodiment of the present invention.

Alternatively, in a third embodiment of the present invention, an active layer is provided on a semiconductor substrate 100, as shown in FIG. 10. Then, a gate oxide layer 110 having a thickness between 50~300 Å is formed on the semiconductor substrate 100. The formation approach of the gate oxide layer 110 is similar to that as previously stated.

After the formation of the gate oxide layer 110, a poly-silicon layer 120 having a thickness between 2500~3500 Å is deposited. The poly-silicon layer 120, which is formed by CVD, serves as a portion of a poly gate and the poly-silicon layer of a polycide gate.

After the deposition of the poly-silicon layer 120, a capped dielectric layer 130 having a thickness between 500~1500 Å is deposited by chemical vapor deposition (CVD). The capped dielectric layer 130 contains silicon oxide or silicon nitride and serves as a mask for protecting the suicide layer from being etched in the following poly-silicon etching step. Then, a photo-resist layer 140 is formed in the poly gate region with a mask for patterning a poly gate and serving as a mask for up-coming etching process, as shown in FIG. 10.

Figure 11:
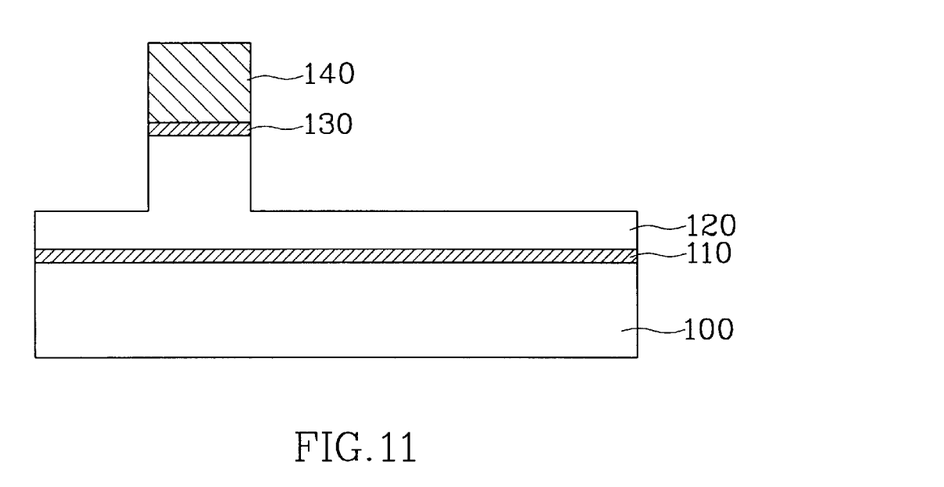
FIG. 11 is a cross-sectional view showing the etching of the capped dielectric layer and a portion of the poly-silicon layer according to a third embodiment of the present invention.
Figure 12:
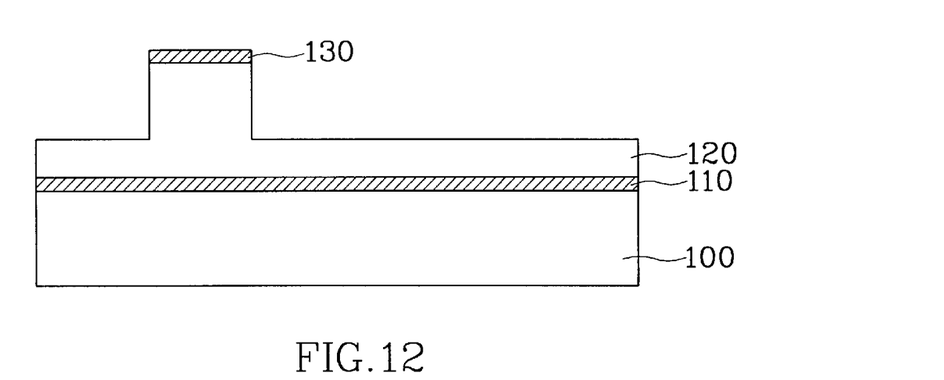
FIG. 12 is a cross-sectional view showing the removal the first photo-resist layer according to a third embodiment of the present invention.

Referring now to FIG. 11, the exposed portion of the capped dielectric layer 130 and the poly-silicon layer 120 are etched sequentially. The poly-silicon layer 120 is etched 1500~2500 Å in thickness by anisotropic plasma etching. Then, the photo-resist layer 140 is removed, as shown in FIG. 12.

Figure 13:
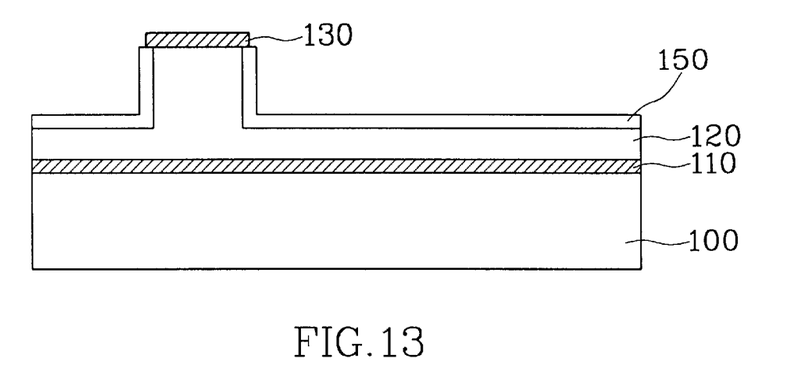
FIG. 13 is a cross-sectional view showing the formation of a silicon oxide layer on the poly-silicon layer according to a third embodiment of the present invention.
Figure 14:
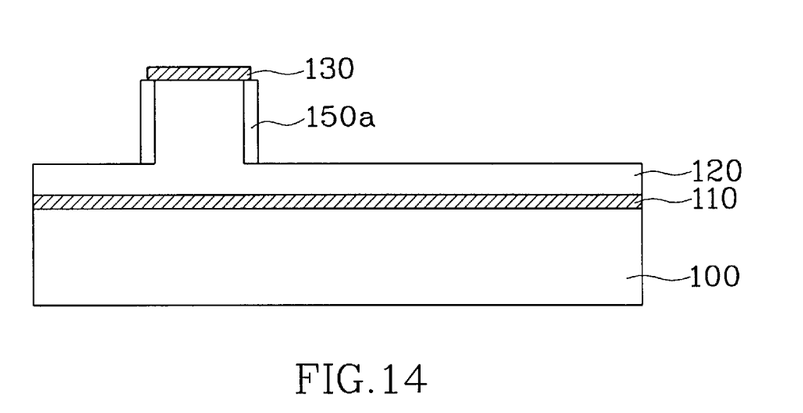
FIG. 14 is a cross-sectional view showing the formation of spacers on the sidewall of the poly-silicon layer by etching the silicon oxide layer according to a third embodiment of the present invention.

For the key technique disclosed in the present invention, please refer to FIG. 13, wherein thermal oxidation is performed on the poly-silicon layer 120 so as to form a silicon oxide layer 150 having a thickness between 100~1000 Å on the surface of the poly-silicon layer 120. The silicon oxide layer 150 is then treated with anisotropic plasma etch back process to form a spacer 150a, as shown in FIG. 14. Since the poly-silicon layer 120 is performed with thermal oxidation, part of the formed silicon oxide layer 150 grows alone the direction towards the inner part of the poly-silicon layer 120 and finally forms a spacer 150a that provides better protection than the prior arts. Another important thing is that the thickness of spacer 150a can be controlled more exactly than the previous CVD deposition.

Figure 15:
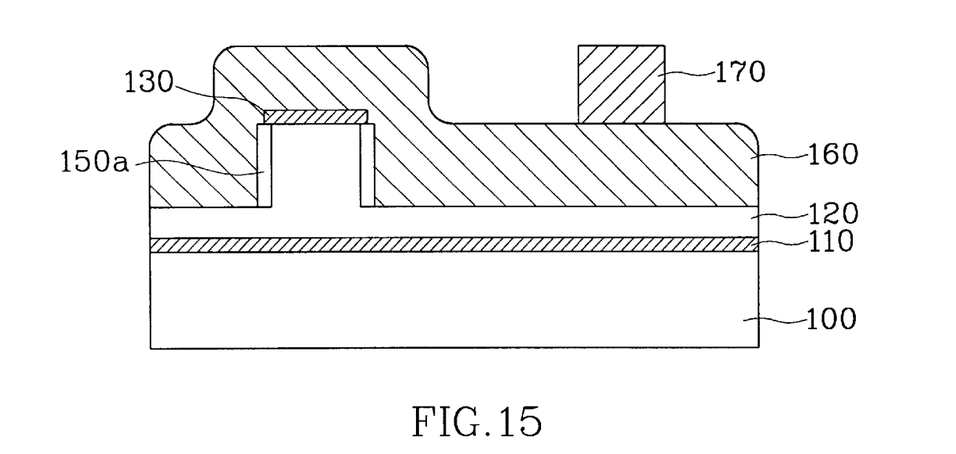
FIG. 15 is a cross-sectional view showing the deposition of a silicide layer and the formation of a second photo-resist layer according to a third embodiment of the present invention.

Referring to FIG. 15, a silicide layer 160 having a thickness between 1500~2500 Å (which is similar to that of the removed poly silicon layer 120 shown in FIG. 11) is further deposited. Then, a photoresist layer 170 is formed in the polycide gate region with a mask for patterning a polycide gate and serving as a mask for up-coming etching process. The metal element in silicide is selected from the group of refractory metals, such as Ti, Mo, Ta, Pt, and W. Tungsten silicide (WSi$_x$) is usually provided for semiconductor processing.

Figure 16:
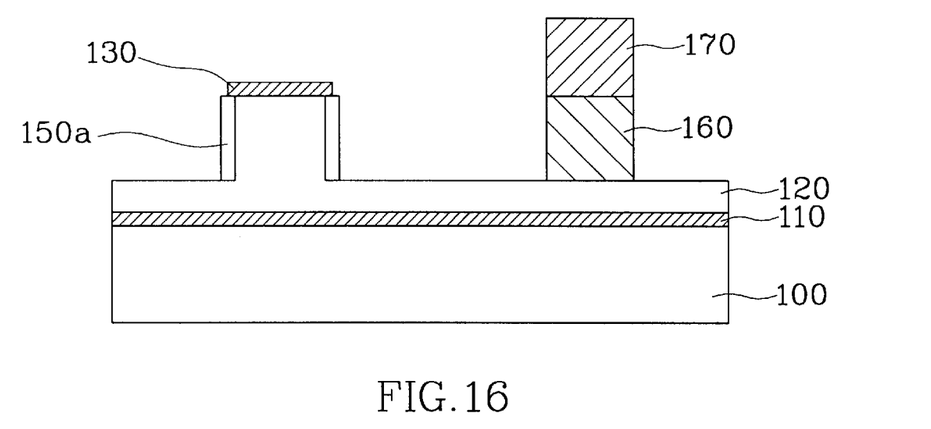
FIG. 16 is a cross-sectional view showing the etching of the silicide layer according to a third embodiment of the present invention.
Figure 17:
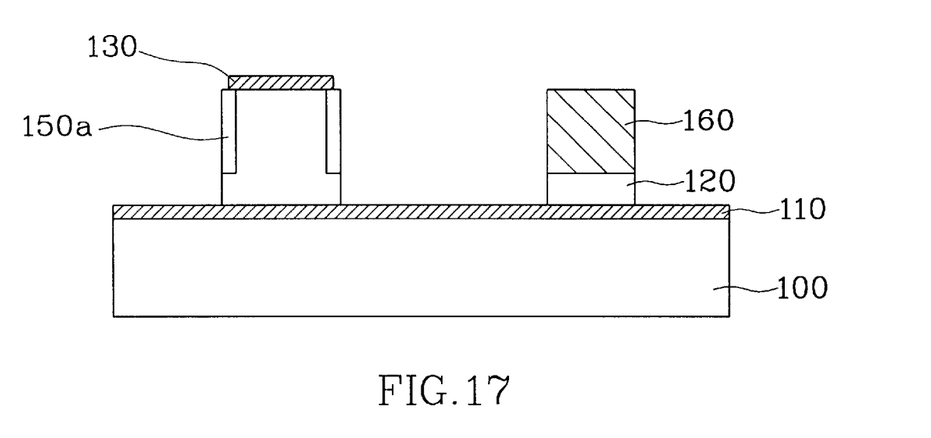
FIG. 17 is a cross-sectional view showing the etching of the poly-silicon layer and the removal of the second photo-resist layer according to a third embodiment of the present invention.

Next, as shown in FIG. 16, the exposed portion of silicide layer 160 is treated with anisotropic plasma etching. Then the poly-silicon layer 120 is also treated with anisotropic plasma etching. During the etching process of the poly-silicon layer 120, the polycide gate is protected by the photo-resist layer 170 and the poly gate is protected by the capped dielectric layer 130 and the spacer 150a. Finally, the photo-resist layer 170 is removed and thus the poly gate and the polycide gate with an equal height are fabricated on one chip, as shown in FIG. 17.

From the above description, the height of the poly gate is almost equal to the height of the polycide gate in the present invention. Therefore, the poly gate has a lower sheet resistance than it in the prior art. Thereby the difference of sheet resistance between poly gate and polycide gate is reduced, and which can lower the difference of accessing speed between the cell area and the periphery area in an image device to achieve a better operating state.

Alternatively, the polycide gate in the above embodiments can be replaced by a poly-metal gate having a double-layer structure of a poly-silicon layer and a metal layer, which is overlaying the poly-silicon layer. The poly-metal gate can provide a lower sheet resistance than a poly gate, wherein the metal layer is selected from the group of refractory metals, such as Ti, Mo, Ta, Pt, and W.

It is to be understood that although the present invention has been described with reference to particular preferred embodiments, it should be appreciated that numerous modifications, variations and adaptations may be made without departing from the scope of the invention as defined in the claims.

What is claimed is:

1. A method of forming poly-silicon gate and polycide gate in a semiconductor device fabricated on a substrate, said method comprising:

(a) forming a gate oxide layer on a substrate;

(b) sequentially depositing a poly-silicon layer and a capped dielectric layer;

(c) patterning a poly-silicon gate by using a first photo-resist layer, and then etching said capped dielectric layer and a portion of said poly-silicon layer having a certain thickness;

(d) removing said first photo-resist layer;

(e) performing thermal oxidation on said poly-silicon layer so as to form a silicon oxide layer on said poly-silicon layer;

(f) forming spacers on the sidewall of said poly-silicon layer;

(g) depositing a metal-silicide layer;

(h) patterning a polycide gate by using a second photo-resist layer, and etching said metal-silicide layer and said poly-silicon layer;

(j) removing the second photo-resist layer.

2. The method as recited in claim 1, wherein said gate oxide layer has a thickness between 100~500 Å.

3. The method as recited in claim 1, wherein said poly-silicon layer has a thickness of 3000 Å.

4. The method as recited in claim 1, wherein said capped dielectric layer has a thickness between 300~1500 Å.

5. The method as recited in claim 1, wherein said capped dielectric layer is silicon oxide.

6. The method as recited in claim 1, wherein said capped dielectric layer is silicon nitride.

7. The method as recited in claim 1, wherein the thickness of said portion of said poly-silicon layer in said step (c) is equal to the thickness of said metal-silicide layer in said step (g).

8. The method as recited in claim 1, wherein said portion of said poly-silicon layer in step (c) has a thickness between 1500~2500 Å.

9. The method as recited in claim 1, wherein said metal-silicide layer has a thickness between 1500~2500 Å.

10. The method as recited in claim 1, wherein said step (c), in which said capped dielectric layer and a portion of said poly-silicon layer are etched, is done by anisotropic plasma etching.

11. The method as recited in claim 1, wherein said oxide layer in said step (e) has a thickness between 100~1000 Å.

12. The method as recited in claim 1, wherein said step (h), in which said metal-silicide layer and said poly-silicon layer are etched, is done by anisotropic plasma etching.

13. The method as recited in claim 1, wherein said poly-silicon layer is composed of doped poly-silicon.

14. The method as recited in claim 1, wherein said metal-silicide layer is composed of $WSi_x$.

15. The method as recited in claim 1, wherein the metal element of said mental-silicide layer is selected from Ti, Mo, Ta, Pt, and W.

16. The method as recited in claim 1, wherein said spacer is composed of silicon oxide.

* * * * *